US008982596B1

United States Patent
Srinivasan et al.

(10) Patent No.: US 8,982,596 B1
(45) Date of Patent: Mar. 17, 2015

(54) CONTENT ADDRESSABLE MEMORY HAVING COLUMN SEGMENT REDUNDANCY

(75) Inventors: Varadarajan Srinivasan, Los Altos Hills, CA (US); Bindiganavale S. Nataraj, Cupertino, CA (US); Sandeep Khanna, Los Altos, CA (US)

(73) Assignee: Netlogic Microsystems, Inc., Santa Clara, CA (US)

( * ) Notice: Subject to any disclaimer, the term of this patent is extended or adjusted under 35 U.S.C. 154(b) by 433 days.

(21) Appl. No.: 13/301,499

(22) Filed: Nov. 21, 2011

(51) Int. Cl.
*G11C 15/00* (2006.01)
*G11C 15/04* (2006.01)
*G11C 29/24* (2006.01)
*G11C 29/00* (2006.01)

(52) U.S. Cl.
CPC .............. *G11C 15/00* (2013.01); *G11C 15/04* (2013.01); *G11C 29/24* (2013.01); *G11C 29/70* (2013.01)
USPC .................. 365/49.16; 365/49.11; 365/49.15; 365/49.1; 365/49.17; 365/200; 711/108; 714/711; 714/710

(58) Field of Classification Search
CPC ........ G11C 15/00; G11C 15/04; G11C 29/24; G11C 29/70
USPC ............ 365/200, 49.1, 49.11, 49.15, 49.16, 365/49.17; 711/108; 714/710, 711
See application file for complete search history.

(56) References Cited

U.S. PATENT DOCUMENTS

| | | | |
|---|---|---|---|
| 6,249,467 B1 | 6/2001 | Pereira et al. | |
| 6,275,426 B1 | 8/2001 | Srinivasan et al. | |
| 6,445,628 B1 | 9/2002 | Pereira et al. | |
| 6,657,878 B2 | 12/2003 | Lien et al. | |
| 6,714,430 B1 | 3/2004 | Srinivasan et al. | |
| 6,751,755 B1 | 6/2004 | Sywyk et al. | |
| 6,804,135 B1 | 10/2004 | Srinivasan et al. | |
| 6,865,098 B1 | 3/2005 | Ichiriu et al. | |
| 6,870,749 B1 | 3/2005 | Park et al. | |
| 7,016,243 B1 | 3/2006 | Srinivasan et al. | |
| 7,221,575 B1 | 5/2007 | Jiang | |
| 7,924,589 B1 | 4/2011 | Srinivasan et al. | |
| 2003/0081464 A1* | 5/2003 | Vlasenko | 365/200 |
| 2005/0024976 A1* | 2/2005 | Kang et al. | 365/232 |

* cited by examiner

*Primary Examiner* — J. H. Hur
(74) *Attorney, Agent, or Firm* — Sterne Kessler Goldstein & Fox P.L.L.C.

(57) ABSTRACT

A CAM device includes a CAM array that can implement column redundancy in which a defective column segment in a selected block can be functionally replaced by a selected column segment of the same block, and/or by a spare column segment of the same block.

27 Claims, 8 Drawing Sheets

CONTENT ADDRESSABLE MEMORY HAVING COLUMN SEGMENT REDUNDANCY

TECHNICAL FIELD

The present embodiments generally relate to content addressable memory (CAM) devices, and more particularly to CAM devices having column redundancy techniques that allow for the replacement of column segments in only selected blocks of CAM cells.

BACKGROUND

Column redundancy has been used to improve the yield of content addressable memory (CAM) devices. For example, a defective column of CAM cells can be replaced with a redundant column of CAM cells. It would be desirable to increase the granularity of column redundancy techniques in CAM devices to maximize yield and eliminate the discarding of usable portions of columns found to contain defects.

BRIEF DESCRIPTION OF THE DRAWINGS

Present embodiments are illustrated by way of example, and not by way of limitation, in the figures of the accompanying drawings and in which like reference numerals refer to similar elements and in which.

Like reference numerals refer to corresponding parts throughout the drawing figures.

DETAILED DESCRIPTION

A method and apparatus for performing column redundancy using split or segmented bit lines in a CAM device are disclosed. In the following description, numerous specific details are set forth in order to provide a thorough understanding of the present embodiments. However, it will be apparent to one skilled in the art that these specific details may not be required to practice the present embodiments. It is to be understood that the present embodiments are equally applicable to CAM structures of other sizes and configurations, as well as to other types of memory devices such as, for instance, RAM, Flash, and EEPROM. In other instances, well-known circuits and devices are shown in block diagram form to avoid obscuring the present embodiments unnecessarily. Additionally, the interconnection between circuit elements or blocks can be shown as buses or as single signal lines. Each of the buses can alternatively be a single signal line, and each of the single signal lines can alternatively be a bus. Further, the logic levels assigned to various signals in the description below are arbitrary, and therefore can be modified (e.g., reversed polarity) as desired. Accordingly, the present embodiments are not to be construed as limited to specific examples described herein but rather include within their scope all embodiments defined by the appended claims.

In accordance with the present embodiments, a CAM device is disclosed that can functionally replace a defective segment of a column of CAM cells with a corresponding segment of a spare column of CAM cells while retaining use of other non-defective segments of the column of CAM cells. In this manner, the present embodiments can achieve a finer level of granularity when replacing defective portions of a CAM array than conventional approaches that replace an entire column of CAM cells with an entire column of spare CAM cells. Indeed, the ability to replace only a defective segment of the column with another selected column segment provides improved redundancy and increased yield because the remaining usable portions of the column are not disabled.

More specifically, the CAM device includes an array of CAM cells logically divided into a plurality of CAM blocks, and includes a plurality of column segment shift circuits. Each CAM block includes a number of main column segments of CAM cells and a spare column segment of CAM cells. Thus, each main column of the array is logically divided into a plurality of main column segments, with each main column segment positioned within an associated one of the CAM blocks. Similarly, the spare column is logically divided into a plurality of spare column segments, with each spare column segment positioned within an associated one of the CAM blocks. Each column segment shift circuit is coupled to an associated CAM block, and can be configured to functionally replace a defective column segment in the associated CAM block with another selected column segment in the same CAM block. In this manner, the defective segment of a particular column can be functionally replaced with another column segment in the same CAM block without replacing other non-defective segments of the particular column, thereby improving column redundancy by retaining the use of non-defective segments of the particular column. This is in marked contrast to conventional column redundancy techniques that replace an entire column of CAM cells with another entire column of CAM cells even though some portions of the column are usable.

Figure 1:
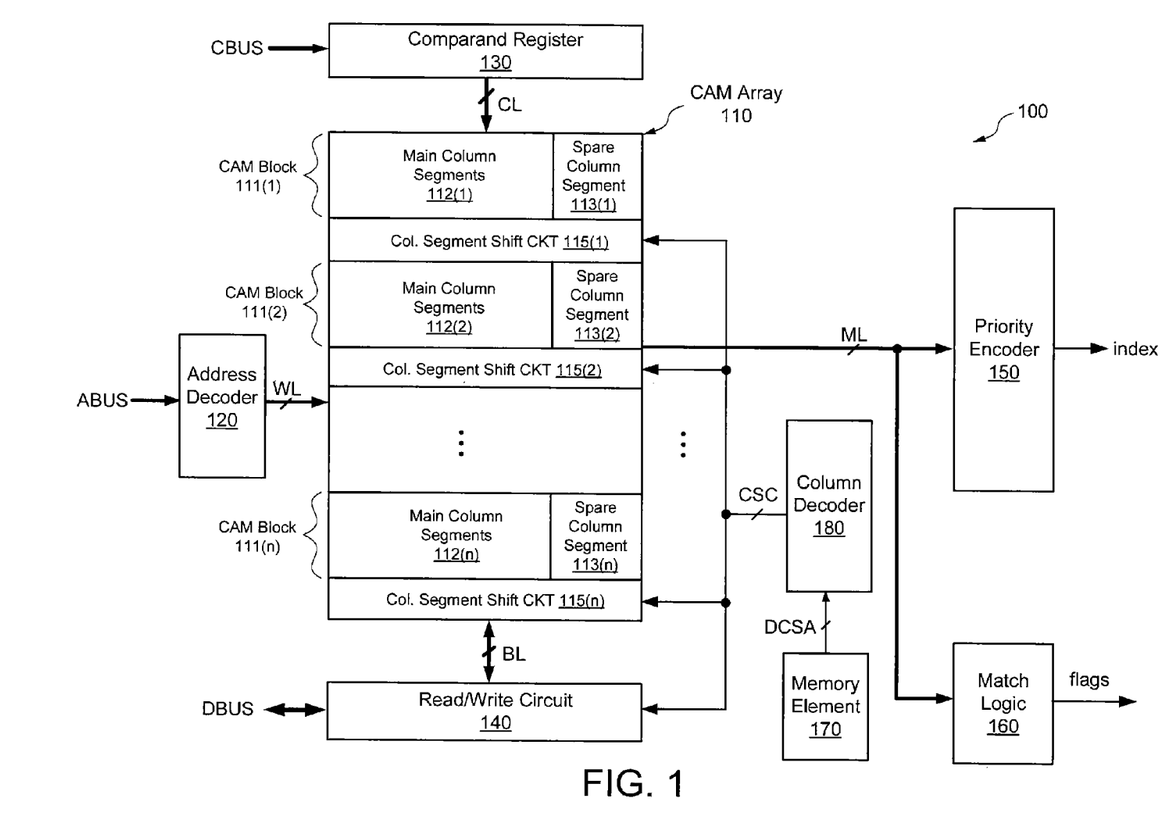
FIG. 1 is a block diagram of a CAM device in accordance with the present embodiments.

FIG. 1 is a block diagram of a CAM device 100 in accordance with the present embodiments. CAM device 100 includes a CAM array 110, an address decoder 120, a comparand register 130, a read/write circuit 140, a priority encoder 150, match logic 160, a memory element 170, and a column decoder 180. CAM array 110 includes a multitude of CAM cells logically divided into a plurality of CAM blocks 111(1)-111(n), and includes a plurality of column segment shift circuits 115(1)-115(n). Each CAM block 111 includes a number of main column segments 112 and a spare column segment 113, wherein each column segment 112 and 113 includes a plurality of CAM cells. Thus, each main column 112 of CAM array 110 is logically divided into a plurality of main column segments 112(1)-112(n), with each main column segment 112 positioned within an associated one of the CAM blocks 111. Similarly, the spare column 113 is logically divided into a plurality of spare column segments 113(1)-113(n), with each spare column segment 113 positioned within an associated one of the CAM blocks 111. For example, first CAM block 111(1) includes a plurality of main column segments 112(1) and a spare column segment 113(1), second CAM block 111(2) includes a plurality of main column segments 112(2) and a spare column segment 113(2), and so on.

Each column segment shift circuit 115 is coupled to an associated CAM block 111, and can be configured to functionally replace a defective column segment in the associated CAM block 111 with another selected column segment in the same CAM block 111. More specifically, each column segment shift circuit 115 can functionally replace a defective column segment 112 in the associated CAM block 111 with a selected column segment (e.g., the spare column segment 113) in the same CAM block 111 independently of other CAM blocks. In this manner, the defective column segment can be functionally replaced by the selected column segment without replacing any other segments of the column (e.g., that lie within other CAM blocks 111), thereby allowing other (non-defective) portions of the column to remain operational and allowing spare segments in other blocks to be used to repair other defective column segments (e.g., in their respective blocks). For some embodiments, the column segment shift circuit 115 functionally replaces the defective column segment 112 in the associated CAM block 111 with an adjacent column segment in the associated CAM block 111, and replaces each column segment subsequent to the defective column segment in the associated CAM block 111 with a corresponding adjacent column segment in the same CAM block 111, wherein a last column segment 112 in the associated CAM block 111 is replaced with the spare column segment 113 in the CAM block 111. For other embodiments, the column segment shift circuit 115 functionally replaces the defective column segment 112 in the associated CAM block 111 with the spare column segment 113 in the associated CAM block 111.

The CAM cells in CAM array 110 can be any suitable type of CAM cells including, for example, binary, ternary, and/or quaternary CAM cells. For purposes of discussion herein, the CAM cells within the main column segments 112 are referred to as main CAM cells, and the CAM cells within the spare column segments 113 are referred to as spare CAM cells. Further, note that for exemplary embodiments described herein, the main column segments 112 and the spare column segments 113 are structurally identical, and each of column segments 112 and 113 can operate as an independent column of CAM cells.

One or more instructions and related control signals can be provided to CAM device 100 from an instruction decoder (not shown for simplicity) to control read, write, and compare operations for CAM device 100. Other well-known signals that can be provided to CAM device 100, such as enable signals, reset signals, and clock signals, are not shown for simplicity.

Each row of CAM cells in array 110 is coupled to address decoder 120 via a corresponding word line WL, and to priority encoder 150 and to match logic 160 via a corresponding match line ML. The word lines WL and match lines ML are represented collectively in FIG. 1 for simplicity. For one embodiment, address decoder 120 receives addresses from an address bus ABUS. For other embodiments, address decoder 120 receives addresses from another bus. The match lines ML provide match results of compare operations to priority encoder 150, which determines the matching entry that has the highest priority number associated with it and generates the index or address of this highest priority match (HPM). Match logic 160 can generate a match flag to indicate a match condition, and can generate a multiple match flag to indicate multiple matches.

Further, although not shown in FIG. 1 for simplicity, each row of CAM cells in CAM array 110 can have one or more validity bits to indicate whether the corresponding row (or segment thereof) of CAM cells stores valid data. Match logic 160 can monitor the state of the validity bits and assert a full flag when all of the rows of CAM cells in CAM array 110 are filled with valid entries. The validity bits can also be provided to priority encoder 150 to generate the next free address (NFA) that is available in CAM array 110 for storing new data.

Each column of CAM cells in CAM array 110 is coupled to read/write circuit 140 via a corresponding pair of bit lines BL, and is coupled to comparand register 130 via a corresponding pair of comparand lines CL. Comparand words (e.g., search keys) can be provided to comparand register 130 from a comparand bus CBUS. Read/write circuit 140 includes well-known write drivers and sense amplifiers, and is coupled to a data bus DBUS to receive data words.

The bit lines BL and comparand lines CL are represented collectively in FIG. 1 for simplicity. More specifically, the bit lines BL and comparand lines CL extending through CAM array 110 are segmented at the boundaries between adjacent CAM blocks 111 so that the CAM cells in each column segment 112 are coupled to an associated column segment shift circuit 115 via corresponding bit line segments and comparand line segments, as discussed in more detail below.

Column segment shift circuits 115(1)-115(n) can be any well-known switching logic such as, for example, a crossbar logic circuit, a switch matrix, translation logic, data filter, or mapping circuit that selectively steers data to and from selected column segments of CAM array 110 in response to one or more column segment control (CSC) signals provided, for example, by column decoder 180. More specifically, column segment shift circuits 115(1)-115(n) can be used to steer read data, write data, and comparand data (e.g., bits or groups of bits) originally intended for (or associated with) one column segment 112 in a given CAM block 111 to another column segment 112 in the same CAM block 111 to functionally replace the one column segment 112 with the other column segment 112 in the same CAM block 111. For other embodiments, column segment shift circuits 115(1)-115(n) can be the same circuit, and/or CBUS and DBUS can be the same bus.

One or more spare column segments 113(1)-113(n) can be selected to replace one or more corresponding defective main column segments 112 in CAM array 110 as follows. Initially, CAM array 110 is tested using any generally known testing methodology and/or hardware to determine if any column segments in CAM array 110 contain defects. Then, if a segment of a column of CAM cells is found to contain defects, the address of the defective column segment is programmed as a defective column segment address (DCSA) into memory element 170. Memory element 170 can be any suitable non-volatile storage device or element including, for example, PROM, EEPROM, flash memory, and/or fuses. For other embodiments, memory element 170 can be eliminated, and the defective column segment address can be stored in a suitable external memory device and provided to CAM device 100 during initialization or reset.

When programmed, memory element 170 outputs the defective column segment address (DCSA) to column decoder 180, which can be any suitable type of address decoder. Column decoder 180 decodes the DCSA to generate a plurality of column segment control (CSC) signals, which are provided to column segment shift circuits 115(1)-115(n). For the present embodiments, each CSC signal indicates whether a corresponding column segment 112 in one of the CAM blocks 111 of CAM array 110 contains defects, and if so, which column segment of the CAM block 111 is deemed to be defective. For other embodiments, the DCSA can be stored in memory element 170 as a fully decoded signal set CSC, and column decoder 180 can be eliminated.

For exemplary embodiments described herein, the DCSA can be expressed in the format DCA.DSA, where DCA is the defective column address and DSA is the defective segment address. More specifically, the DCA is a binary number or address indicating which column in CAM array 110 contains defects, and the DSA is a binary number or address indicating which segment of the indicated column contains the defects. For example, a DCSA of "000010.001" indicates that the third column (indicated by DCA=000010) contains defects, and that the defects are located in the second segment (indicated by DSA=001). For other embodiments, the DCSA can include separate values that identify the column containing defects and which segment of that column is defective. Indeed, a person of ordinary skill in the art will understand that any addressing representation that indicates which segment of a particular column of CAM cells contains defects can be used as the DCSA for the present embodiments.

In response to the CSC signals, column segment shift circuits 115(1)-115(n) shift data access for the defective column segment and all subsequent (e.g., higher addressed or rightmost) column segments by one column for only the associated CAM block 111 that contains the defective column segment. Thus, for write operations in which a given CAM block 111 is found to contain defects, the column segment shift circuit 115 associated with the given CAM block 111 shifts data originally intended to be stored in the defective column segment and in all subsequent column segments of the given CAM block 111 by one column to the right (or left, if the spare column segment is to the left of the main column segments). For read operations, the column segment shift circuit 115 shifts data received from all column segments subsequent to the defective column segment in the given CAM block 111 back by one column to the left (or right, if the spare column segment is to the left of the main column segments). For compare operations, column segment shift circuit 115 steers comparand data away from the defective column segment by shifting the comparand data bits for the defective column segment and for all subsequent column segments in the given CAM block 111 by one column to the right (or left, if the spare column segment is to the left of the main column segments). In this manner, the column segment shift circuits 115(1)-115(n) can functionally replace the defective column segment and all subsequent column segments in the given CAM block 111 with corresponding adjacent column segments in the same CAM block 111, where the last column segment 112 is functionally replaced with a corresponding spare column segment 113. Note that the defective segment of a particular column is functionally replaced by another column segment 112 in the same CAM block 111 without replacing or otherwise affecting the operation of other segments of the particular column (e.g., that lie in other CAM blocks 111).

For other embodiments, a main column segment 112 found to be defective can be functionally replaced by the spare column segment 113 in the same CAM block 111 so that only data corresponding to the defective column segment is steered away from its intended location (e.g., to the corresponding spare column segment 113).

Figure 2:
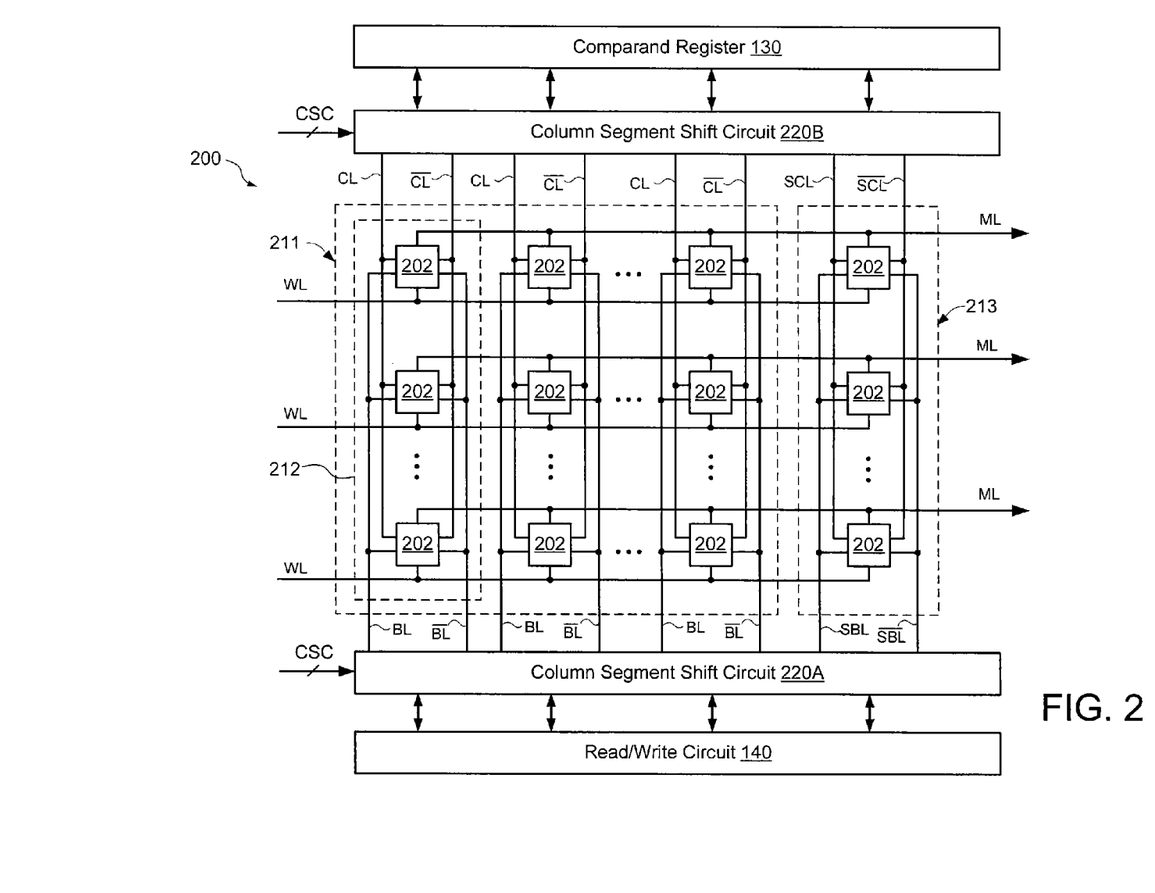
FIG. 2 is a block diagram of one embodiment of the CAM block of FIG. 1.

FIG. 2 shows a CAM block 200 that is one embodiment of a respective CAM block 111 of FIG. 1. CAM block 200 includes a main CAM array block 211 having a plurality of main CAM cells 202 organized in any number of rows and any number of column segments 212, and includes a spare column segment 213 having a number of spare CAM cells 202. For the exemplary embodiment of FIG. 2, the column segment shift circuit is represented as first and second column segment shift circuit portions 220A and 220B, where first portion 220A selectively steers read and write data to and from CAM array 211, and second portion 220B selectively steers comparand data to CAM array 211, as discussed in more detail below.

CAM cells 202 can be any suitable type of CAM cell, including binary CAM cells, ternary CAM cells, and quaternary CAM cells. For simplicity, only one spare column segment 213 is shown in FIG. 2, although in other embodiments, spare column segment 213 can include any number of spare columns of CAM cells 202.

Each row of CAM cells 202 is coupled to a match line ML and to a word line WL. Referring also to FIG. 1, each word line WL is driven by address decoder 120 to select one or more rows of CAM cells 202 for writing or reading, and each match line ML provides the match results of a compare operation to priority encoder 150 and to match logic 160. A match line ML indicates a match condition for the row only if all data stored in CAM cells 202 in that row match the comparand data. In some embodiments, the match lines ML are pre-charged (e.g., to logic high) for the compare operation. Thereafter, if the data stored in one or more CAM cells 202 in a particular row does not match corresponding bits of the search key, then those one or more CAM cells 202 discharge the row's match line ML low (e.g., toward ground potential) to indicate the mismatch condition. Conversely, if the data stored in all CAM cells 202 of a particular row match corresponding bits of the search key, then the row's match line ML remains in its charged (e.g., logic high) state to indicate the match condition.

Each main column segment 212 is coupled to a complementary bit line segment pair BL and $\overline{BL}$, and to a complementary comparand line segment pair CL and $\overline{CL}$. Spare column segment 213 is coupled to a complementary spare bit line segment pair SBL and $\overline{SBL}$, and to a complementary spare comparand line segment pair SCL and $\overline{SCL}$. The bit line segment pairs BL and $\overline{BL}$ and spare bit line segment pairs SBL and $\overline{SBL}$ are each coupled to read/write circuit 140 via first portion 220A of the column segment shift circuit. Read/write circuit 140 includes write drivers or buffers to provide data to selected bit line segment pairs BL and $\overline{BL}$ and/or to spare bit line segment pairs SBL and $\overline{SBL}$ during write operations, and includes sense amplifiers to read data output from CAM cells 202 onto selected bit line segment pairs BL and $\overline{BL}$ and/or spare bit line segment pairs SBL and $\overline{SBL}$ during read operations.

The comparand line segment pairs CL and $\overline{CL}$ and the spare comparand line segment pair SCL and $\overline{SCL}$ are each coupled to comparand register 130 via second portion 220B of the column segment shift circuit. Comparand register 130 drives the comparand word or search key received from the CBUS onto selected comparand line segment pairs CL and $\overline{CL}$ and/or spare comparand line segment pairs SCL and/or $\overline{SCL}$ for comparison with data stored in CAM cells 202 during compare operations.

For some embodiments, the first portion 220A of the column segment shift circuit can include a number of write drivers to increase the strength with which write data is driven onto the bit line segment pairs BL/$\overline{BL}$, and the second portion 220B of the column segment shift circuit can include a number of write drivers to increase the strength with which comparand data is driven onto the comparand line segment pairs CL/$\overline{CL}$. Further, note that the first and second portions 220A and 220B of column segment shift circuit 115 are shown separately in FIG. 2 to illustrate the functions of column segment shift circuit 115 that (1) selectively steer data associated with the bit line segments BL/$\overline{BL}$ of CAM block 200 and (2) selectively steer data associated with the comparand line segments CL/$\overline{CL}$ of CAM block 200. For some actual embodiments, the first and second portions 220A and 220B of column segment shift circuit 115 can be formed as part of the same circuit.

For alternate embodiments, other CAM array architectures can be used. For example, in some embodiments, complementary comparand lines CL and $\overline{CL}$ can be eliminated, in which case the complementary bit lines BL and $\overline{BL}$ can be used to provide the search key to CAM block 200 during compare operations. Similarly, complementary spare comparand lines SCL and $\overline{SCL}$ can be eliminated, in which case the complementary spare bit lines SBL and $\overline{SBL}$ can be used to provide the search key to spare column segment 213. In addition, although CAM block 200 is depicted as a NOR-based CAM array, for other embodiments, CAM block 200 can be a NAND-based CAM array.

Read, write, and compare operations are more fully described below with reference to FIGS. 1 and 2. For write operations, a data word is provided to column segment shift circuit 220A via the read/write circuit 140. If there is not a defective column segment in main CAM array 211, column segment shift circuit 220A passes the data word unaltered onto corresponding bit line segment pairs BL and $\overline{BL}$. The data is written to a row of main CAM array 211 selected by address decoder 120 in a well-known manner, for example, by asserting a word line WL in response to an externally provided address. Because there is not a defective column segment in main CAM array 211, data is not written to any spare column segments 213. For some embodiments, default data (e.g., such as a "don't care" state) can be written to the spare column segment 213 to prevent CAM cells in the unused spare column segment 213 from participating in compare operations.

Referring also to FIG. 1, if there is a defective column segment in main CAM array 211, a DCSA is programmed into memory element 170 to indicate the location of the defective column segment. Column decoder 180 decodes the DCSA to generate the CSC signals, which in turn are used by column segment shift circuit 220A to shift data corresponding to (e.g., intended for) the defective column segment and all subsequent column segments 212 in main CAM array 211 by one column to the right during write operations, and to shift data corresponding to (e.g., originating from) all column segments 212 subsequent to the defective column segment back to the left by one column during read operations. Similarly, column segment shift circuit 220B uses the CSC signals to shift comparand data corresponding to (e.g., intended for) the defective column segment and all subsequent column segments 212 in main CAM array 211 by one column to the right during compare operations. In this manner, the defective column segment and all subsequent column segments 212 can be functionally replaced with corresponding adjacent column segments 212, whereby the last main column segment in CAM block 200 can be functionally replaced by the spare column segment 213 in the same CAM block 200.

For example, if CAM block 200 is the first physical CAM block in CAM array 110 (e.g., having the lowest numerical row addresses), and if the third column segment of CAM block 200 contains one or more defects (e.g., such that the defects are all located within the CAM cells in the third column segment), then a DCSA="000010.000" can be programmed into memory element 170 and provided to column decoder 180. For this example, the DCA=000010 indicates that the third column in CAM array 110 contains defects, and the DSA=000 indicates that the first segment of the third column is defective (e.g., where the first column segment lies within the first CAM block).

For write operations, in response to DCSA, column decoder 180 asserts (e.g., to logic high) a first component of the third CSC signal and all subsequent CSC signals, and de-asserts (e.g., to logic low) the first 2 CSC signals. The de-asserted state of the first two CSC signals causes column segment shift circuit 220A to not shift data originally intended for the first two column segments 212 of CAM cells in CAM block 200, and the asserted states of the first component of the third CSC signal and all subsequent CSC signals causes column segment shift circuit 220A to shift data originally intended for the third column segment and all subsequent column segments by one column to the right. Thus, the shifted data is driven onto corresponding bit line segment pairs BL and $\overline{BL}$ and onto spare bit line segment pairs SBL and $\overline{SBL}$ so that data is stored in non-defective portions (e.g., non-defective column segments) of the CAM array 110. In this manner, data originally intended to be stored in column segments preceding the defective column segment are stored in those column segments in a normal manner, and data originally intended to be stored in the defective third column segment and in all subsequent column segments are instead stored in corresponding adjacent column segments of CAM cells.

More specifically, for the above example, data originally intended to be stored in the first 2 column segments are stored therein in a normal manner, data originally intended to be stored in the third column segment is instead stored in the fourth column segment, data originally intended to be stored in the fourth column segment is instead stored in the fifth column segment, and so on, whereby data originally intended to be stored in the last column segment is instead stored in the spare column segment.

As described above, column segment shift circuit 115 effectively shifts the defective column segment and all subsequent column segments only in the instant CAM block 200 by one column to the right of their original positions, and leaves the column segment alignments in other CAM blocks 200 unaltered. In this manner, referring also to FIG. 1, only the first segment of the spare column 113(1) lying within the first CAM block 111(1) is used for redundancy, thereby leaving other segments of the spare column 113 (e.g., spare column segments 113(2)-113(n) lying within other CAM blocks 111(2)-111(n)) available to replace other potentially defective column segments in the other CAM blocks 111 of CAM array 110. In contrast, conventional column redundancy techniques that replace an entire column of CAM cells having a defect therein with another entire column of CAM cells would essentially discard otherwise usable column segments of CAM cells, thereby needlessly wasting valuable resources of the CAM device. Accordingly, the ability of present embodiments to independently replace some segments of a column of CAM cells without replacing the entire column of CAM cells can more efficiently utilize spare columns of CAM cells, which in turn can achieve higher yields.

For read operations, the data word stored in a row selected by address decoder 120 is provided to column segment shift circuit 220A. In response to the CSC signals, column segment shift circuit 220A re-orders (e.g., re-shifts) the bits of the data word for output onto DBUS. Thus, continuing the example above, if column segment shift circuit 220A shifts the data for the third column segment and all subsequent column segments by one column to the right during the write operation, then column segment shift circuit 220A re-shifts the data from all column segments subsequent to the third column segment by one column back to the left during the read operation for output onto DBUS.

For compare operations, a comparand word is provided to column segment shift circuit 220B via the comparand register 130. If there is a defective column segment in CAM block 200, as indicated by the defective column segment address (DCSA) stored in memory element 170, then column segment shift circuit 220B shifts a portion of the comparand word that corresponds to the defective column segment and all subsequent column segments in CAM block 200 by one column to the right, and passes all other portions of the comparand word (e.g., corresponding to column segments prior to the defective column segment) without change. More specifically, column segment shift circuit 220B steers the comparand bits onto the comparand line segment pairs CL and $\overline{CL}$ and spare comparand line segment pair SCL and $\overline{SCL}$. In this manner, column segment shift circuit 220B uses the CSC signals to steer comparand data away from the defective column segment by shifting bits of the comparand word originally intended for the defective column segment and all subsequent column segments by one column to the right, for example, in a manner similar to that employed by column segment shift circuit 220A during write operations.

Figure 3A:
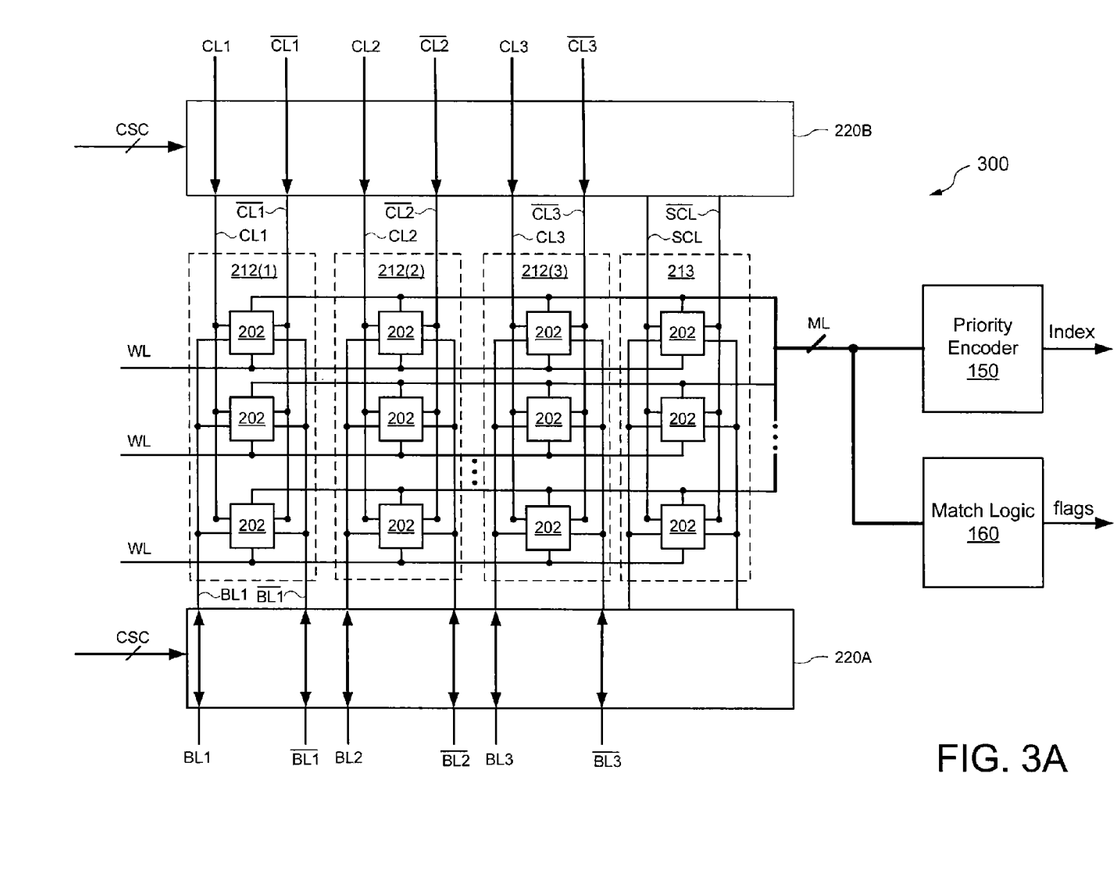
FIG. 3A is a simplified block diagram of an exemplary CAM block having no defects.

FIG. 3A depicts a portion of a CAM block 300 that operates in a normal manner (e.g., without defects) according to the present embodiments. CAM block 300, which is one embodiment of CAM block 200 of FIG. 2, is shown to include 3 main column segments 212(1)-212(3) and one spare column segment 213 for simplicity. Thus, although CAM block 300 is shown to include only 3 main column segments 212 and one spare column segment 213, it is to be understood that for actual embodiments, CAM block 300 can include any number of main column segments 212, and any number of spare column segments 213.

Because there are no defects in CAM block 300 of FIG. 3A, column segment shift circuit 220A does not alter the data written to or read from the CAM block 300 during write and read operations, and column segment shift circuit 220B does not alter the comparand data provided to CAM block 300 during compare operations. Accordingly, column segment shift circuits 220A and 220B are depicted in FIG. 3A as providing data to the originally intended column segments 212 of CAM block 300. For example, column segment shift circuits 220A and 220B provide data intended for first column segment 212(1) thereto in a normal manner, provide data intended for second column segment 212(2) thereto in a normal manner, and provide data intended for third column segment 212(3) thereto in a normal manner. Thus, for the non-defective CAM block 300 depicted in FIG. 3A, column segment shift circuits 220A and 220B do not steer any data to spare column segment 213.

Figure 3B:
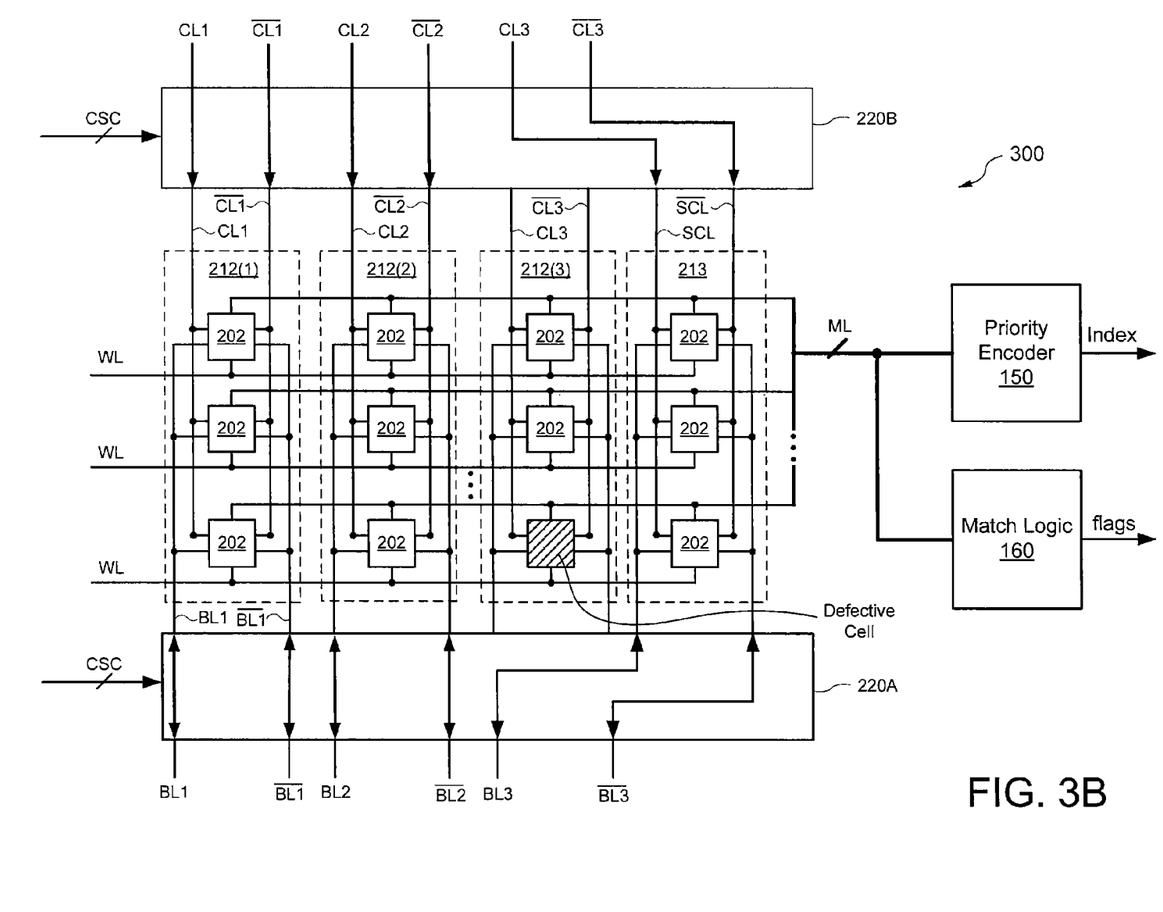
FIG. 3B is a simplified block diagram of the exemplary CAM block of FIG. 3A having a defect.

FIG. 3B shows the same portion of CAM array 300 as FIG. 3A, but having a defect in the third column segment 212(3) of CAM block 300. In accordance with the present embodiments, the location of the defective CAM cell 202 is written into memory element 170 (see also FIG. 1), which in turn generates a defective column segment address (DCSA). In response to the DCSA, the column decoder 180 generates corresponding column segment control signals (CSC) that cause column segment control circuits 220A and 220B to shift data access for the defective column segment 212(3) to the spare column segment 213, as depicted in FIG. 3B.

More specifically, for write operations, column segment shift circuit 220A writes data intended for the first column segment 212(1) into the first column segment 212(1) in a normal manner, writes data intended for the second column segment 212(2) into the second column segment 212(2) in a normal manner, and writes data intended for the defective third column segment 212(3) into the spare column segment 213. Similarly, for compare operations, column segment shift circuit 220B drives comparand data intended for the first column segment 212(1) into the first column segment 212(1) in a normal manner, drives comparand data intended for the second column segment 212(2) into the second column segment 212(2) in a normal manner, and drives comparand data intended for the defective third column segment 212(3) into the spare column segment 213. In this manner, the column segment shift circuits 220A and 220B can functionally replace the defective column segment 212(3) in only the associated CAM block 300 without replacing other segments of the third column that lie within other CAM blocks 300 of CAM array 110. In this manner, a CAM array including CAM block 300 having defects can function as a fully operational (e.g., non-defective) CAM array.

Moreover, because the column segment redundancy techniques disclosed herein can functionally replace individual column segments in one CAM block without functionally replacing other segments of the columns in other CAM blocks, the spare column segments in the other CAM blocks remain available for functionally replacing other column segments in the other CAM blocks. For example, if the first column segment 212(1) in a first CAM block 300 contains defects and the third column segment 212(3) in a second CAM block 300 contains defects, the first column segment 212(1) in the first CAM block 300 can be functionally replaced by the spare column segment 213 in the first CAM block 300 and the third column segment 212(3) in the second CAM block 300 can be functionally replaced by the spare column segment 213 in the second CAM block 300. In contrast, conventional column redundancy techniques that replace entire columns of CAM cells with an entire spare column of CAM cells typically use one entire spare column to functionally replace the first column segment 212(1) in the first CAM block 300 and another entire spare column to functionally replace the third column segment 212(3) in the second CAM block 300, thereby using 2 spare columns for redundancy while the present embodiments use only 2 portions of one spare column.

Figure 4A:
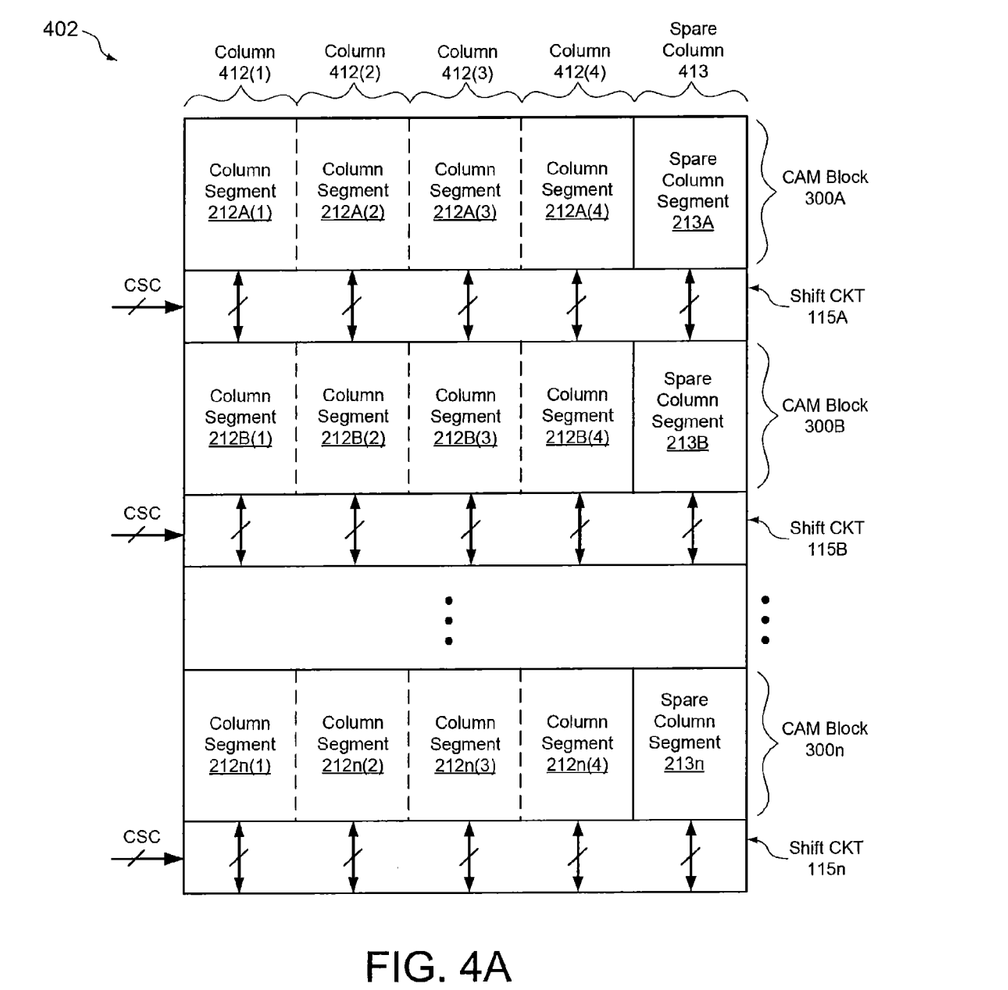
FIG. 4A is a simplified block diagram depicting an exemplary CAM array of the present embodiments that does not contain any defects.

FIG. 4A illustrates a simplified block diagram of a CAM array 402 that operates in a normal manner (e.g., without defects) according to the present embodiments. CAM array 402, which is one embodiment of CAM array 110 of FIG. 1, is shown to include a plurality of CAM blocks 300A-300n (see also FIG. 3A) and associated column segment shift circuits 115A-115n (see also FIG. 1). Each column segment shift circuit 115 selectively shifts data access for its associated CAM block 300 in response to the CSC signals, as described above. Each CAM block 300 is shown to include 4 main column segments 212(1)-212(4) and 1 spare column segment 213, where each of column segments 212 and 213 includes a plurality of CAM cells coupled to a corresponding bit line segment pair and a corresponding comparand line segment pair (not shown in FIG. 4A for simplicity). For example, first CAM block 300A includes 4 main column segments 212A(1)-212A(4) and 1 spare column segment 213A, second CAM block 300B includes 4 main column segments 212B(1)-212B(4) and 1 spare column segment 213B, and so on. Thus, CAM array 402 is shown to include 4 main columns 412(1)-412(4) of CAM cells and 1 spare column 413 of CAM cells, where each main column 412 is divided into n column segments 212A-212n along the CAM block boundaries, and spare column 413 is divided into n spare column segments 213A-213n along the CAM block boundaries (as depicted in FIG. 4A). Thus, for example, first column 412(1) includes n column segments 212A(1), 212B(1), 212C(1), and 212n(1), where column segment 212A(1) lies within first CAM block 300A, column segment 212B(1) lies within second CAM block 300B, and column segment 212n(1) lies within the $n^{th}$ CAM block 300n.

Although each CAM block 300 of CAM array 402 is shown in FIG. 4A to include only 4 main column segments 212(1)-212(4) and 1 spare column segment 213 for simplicity, it is to be understood that for actual embodiments, CAM block 300 can include any number of main column segments 212 and any number of spare column segments 213. Further, each column segment 212 or spare column segment 213 can include any number of CAM cells.

For some embodiments, spare column segments 213A-213n can be masked by driving both of corresponding comparand lines (e.g., CLS and $\overline{CLS}$ in FIG. 2) to the same predetermined logic state (e.g., logic low) to prevent spare column segments 213A-213n from discharging the match line ML. For other embodiments, spare column segments 213A-213n can be masked from compare operations by storing a "don't care" state in each of its CAM cells to prevent spare column segments 213A-213n from discharging the match line ML.

Because there are no defects in CAM array 402 of FIG. 4A, column segment shift circuits 115A-115n do not alter the data written to or read from the array, and do not alter the comparand data provided to array 402 during compare operations. Accordingly, column segment shift circuits 115A-115n are depicted in FIG. 4A as providing data to the originally intended columns of CAM cells. For example, column segment shift circuit 115A provides data intended for CAM block 300A thereto in a normal manner, column segment shift circuit 115B provides data intended for CAM block 300B thereto in a normal manner, and so on, so that data is not steered to any of the spare column segments 213A-213n.

Figure 4B:
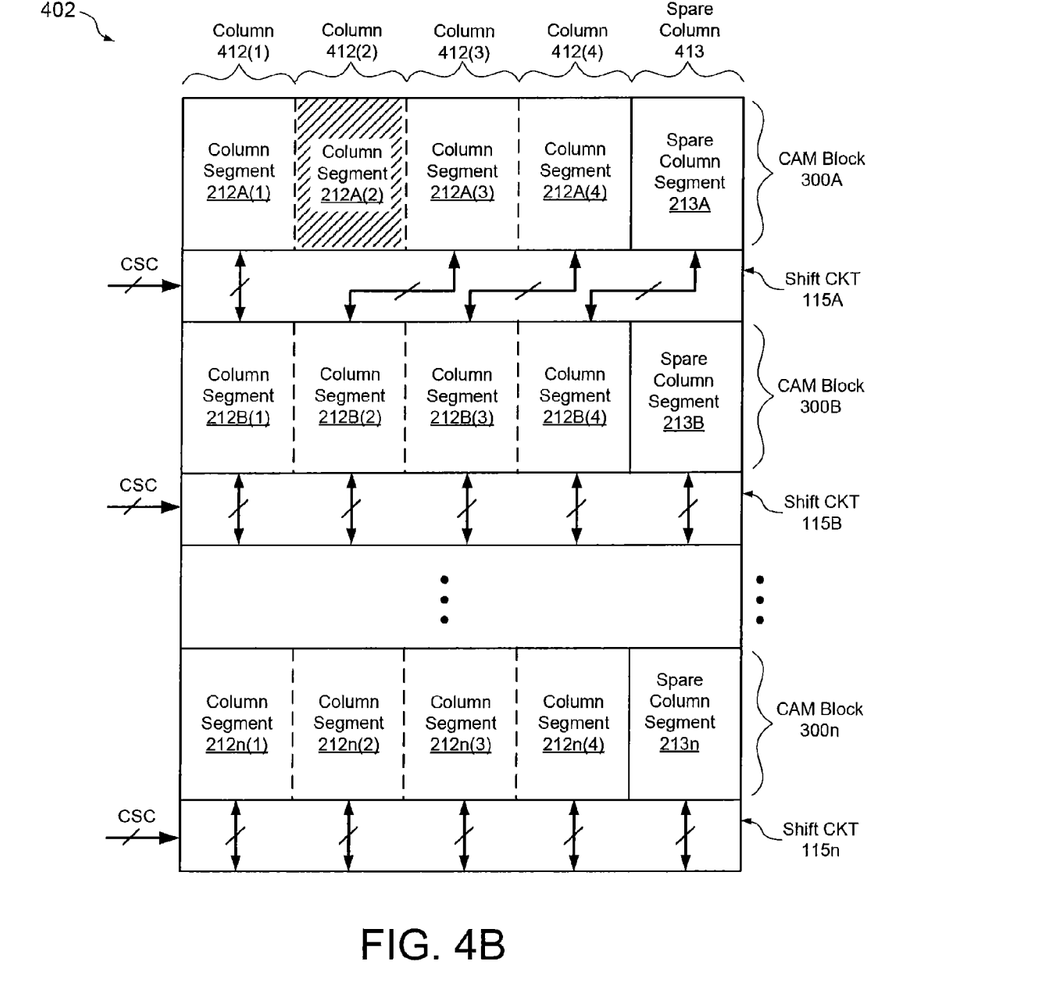
FIG. 4B is a simplified block diagram depicting an exemplary CAM array of the present embodiments that contains defects.

FIG. 4B shows the same portion of CAM array 402 as FIG. 4A, but depicts one or more defects located in the second column segment 212A(2) of the first CAM block 300A. In response thereto, a defective column segment address (DCSA) indicating that the second column segment 212A(2) contains a defect is generated and stored in memory element 170 (see also FIG. 1). The memory element 170 outputs the DCSA to column decoder 180, which in turn generates the corresponding column segment control (CSC) signals. In response to the CSC signals, column segment shift circuit 115A shifts data access for the defective column segment 212A(2) and all subsequent column segments 212A(3) and 212A(4) in the first CAM block 300A by one column to the right for write and compare operations, and re-shifts data access back by one column for read operations.

More specifically, column segment shift circuit 115A shifts data from second column segment 212A(2) to third column segment 212A(3) of CAM block 300A, shifts data from third column segment 212A(3) to fourth column segment 212A(4) of CAM block 300A, and shifts data from fourth column segment 212A(4) to spare column segment 213A of CAM block 300A, as depicted in FIG. 4B. In this manner, the defective column segment 212A(2) is functionally replaced by third column segment 212A(3), the third column segment 212A(3) is functionally replaced by fourth column segment 212A(4), and the fourth column segment 212A(4) is functionally replaced by spare column segment 213A. Note that the data associated with the first column segment 212A(1), which is prior to the defective column segment 212A(2), is not steered to another column segment by column segment shift circuit 115A. Thus, after the column segment replacement is performed by column segment shift circuit 115A, column segments 212A(1), 212A(3), 212A(4), and spare column segment 213A collectively operate as the first CAM block 300A. In this manner, CAM block 300A retains its full functionality even with a defective column segment, and therefore CAM array 402 can function as a fully operational (e.g., non-defective) CAM array.

Moreover, because the column redundancy techniques disclosed herein can functionally replace individual column segments with spare column segments in the same CAM block, rather than replacing entire columns of CAM cells that span across more than one CAM block, spare column segments in other CAM blocks remain unused, and are therefore available for functionally replacing potentially defective column segments in those other CAM blocks. In this manner, the column redundancy techniques disclosed herein can increase yield compared to conventional redundancy techniques that replace an entire column of CAM cells with another entire column of CAM cells.

As discussed above with respect to FIG. 1, column segment shift circuits 115(1)-115(n) can be used to steer read data, write data, and comparand data (e.g., bits or groups of bits) originally intended for (or associated with) one column segment 112 in a given CAM block 111 to another column segment 112 in the same CAM block 111 to functionally replace the one column segment 112 with the other column segment 112 in the same CAM block 111. Further, it is noted that column segment shift circuits 115(1)-115(n) can be any well-known switching logic such as, for example, a crossbar logic circuit, a switch matrix, translation logic, data filter, or mapping circuit that selectively steers data to and from selected column segments of CAM array 110 in response to one or more column segment control (CSC) signals provided, for example, by column decoder 180. For some embodiments, a respective column segment shift circuit 115 can include a plurality of independent multiplexers that can selectively steer data access from an intended column segment 112 in a particular CAM block 111 of CAM array 110 to one of a selected number of other column segments in the same CAM block 111.

Figure 5A:
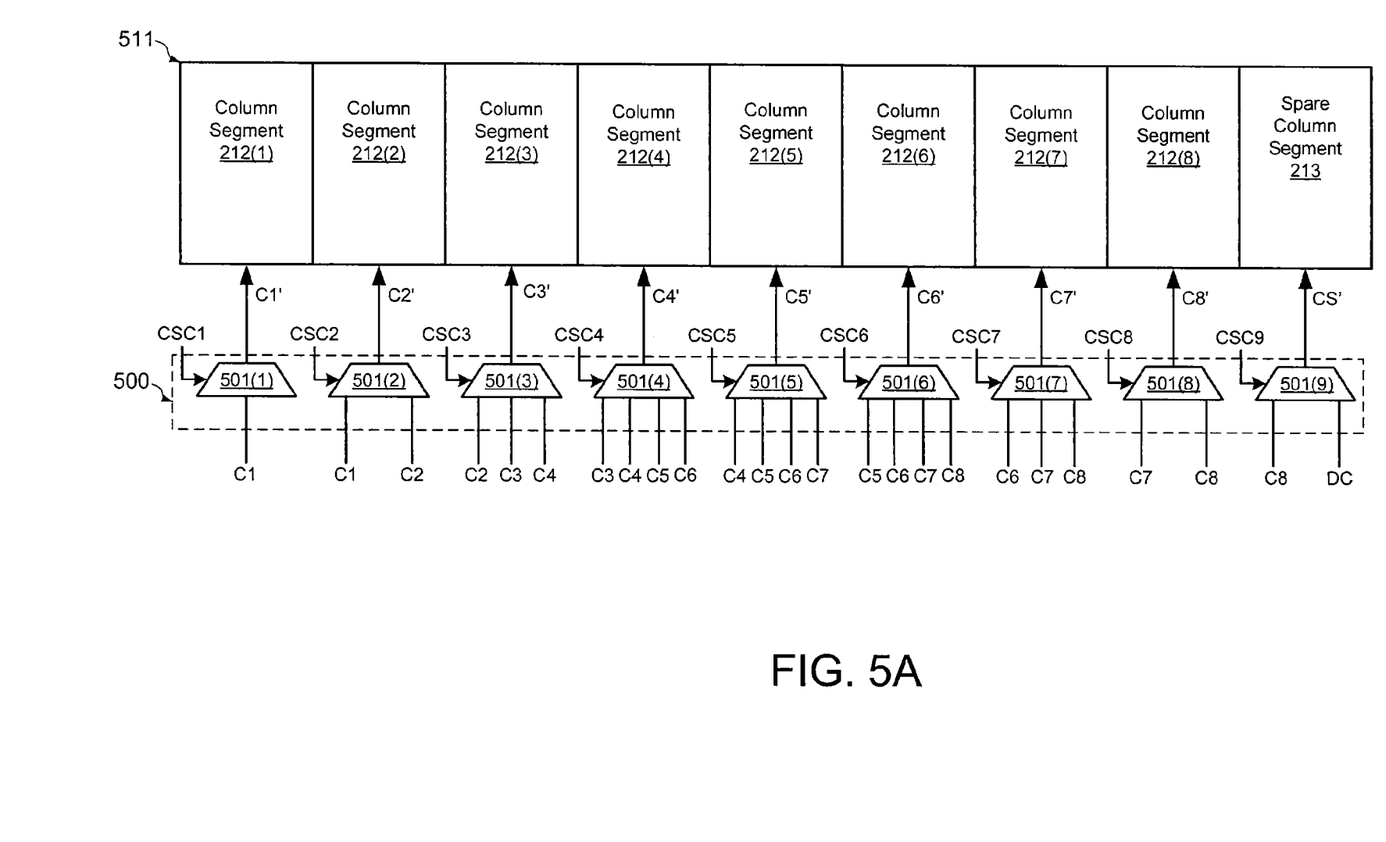
FIG. 5A is a simplified block diagram of one portion of the column segment shift circuit of FIG. 1 according to some embodiments.

For example, FIG. 5A shows a column segment shift circuit 500 that is one portion of one embodiment of the column segment shift circuits 115 of FIG. 1. Shift circuit 500 is coupled to an exemplary CAM block 511 that includes 8 main column segments 212(1)-212(8) and one spare column segment 213 for simplicity; it is to be understood that for actual embodiments, CAM block 511 can include any number of main column segments 212 and any number of spare column segments 213. As depicted in FIG. 5A, shift circuit 500 is implemented as a distributed multiplexer (MUX) circuit having a plurality of independent MUXes 501(1)-501(9) that collectively steer comparand data away from defective column segments 212 to other non-defective column segments 212 and/or to spare column segment 213 during compare operations. More specifically, each MUX 501 includes a number of inputs to receive various bits of an 8-bit comparand word C[8:1], an output coupled to an associated one of column segments 212/213, and a control input to receive a corresponding one of column segment shift signals CSC1-CSC9. Note that for the exemplary embodiment depicted in FIG. 5A, MUXes 501 associated with the exterior column segments receive fewer bits of the comparand word, while MUXes 501 associated with the interior column segments receive more bits of the comparand word. In this manner, shift circuit 500 provides flexibility in selecting replacement column segments, both in terms of shift direction and column segment replacement options.

More specifically, MUX 501(1) selectively provides C1 as a first comparand value C1' to first column segment 212(1) in response to CSC1, MUX 501(2) selectively provides either C1 or C2 as a second comparand value C2' to second column segment 212(2) in response to CSC2, MUX 501(3) selectively provides either C2, C3, or C4 as a third comparand value C3' to third column segment 212(3) in response to CSC3, MUX 501(4) selectively provides either C3, C4, C5, or C6 as a fourth comparand value C4' to fourth column segment 212(4) in response to CSC4, MUX 501(5) selectively provides either C4, C5, C6, or C7 as a fifth comparand value C5' to fifth column segment 212(5) in response to CSC5, MUX 501(6) selectively provides either C5, C6, C7, or C8 as a sixth comparand value C6' to sixth column segment 212(6) in response to CSCE, MUX 501(7) selectively provides either C6, C7, or C8 as a seventh comparand value C7' to seventh column segment 212(7) in response to CSC7, MUX 501(8) selectively provides either C7 or C8 as an eighth comparand value C8' to eighth column segment 212(8) in response to CSC8, and MUX 501(9) selectively provides either CS or a don't care (DC) value as the spare comparand value CS' to the spare column segment 213 in response to CSC9. In this manner, some of the comparand data bits can be selectively shifted either to the right or to the left when implementing column segment redundancy operations disclosed herein. For other embodiments, each of MUXes 501(1)-501(8) can include an additional input to receive the don't care (DC) value and thus can selectively provide the DC value to corresponding column segments 212(1)-212(8) during compare operations. For another embodiment, MUX 501(1) can be omitted, and C1 can be provided directly to first column segment 212(1).

When there are no defects in the CAM block 511, shift circuit 500 does not steer comparand data away from its intended destinations, but rather passes the comparand bits to their originally intended column segments 212. Thus, for example, when there are no defects, MUX 501(1) passes the first comparand bit C1 as C1' to first column segment 212(1), MUX 501(2) passes the second comparand bit C2 as C2' to second column segment 212(2), and so on, where MUX 501(9) passes the DC value to the spare column segment 213 (e.g., to prevent spare column segment 213 from participating in compare operations).

When there are defects in one of the main column segments 212 of the CAM block 511, shift circuit 500 steers comparand data away from the defective column segment 212 to other non-defective column segments 212 and to spare column segment 213. More specifically, because of the distributed multiplexer structure of shift circuit 500, shift circuit 500 can steer some of the comparand bits either to the right or to the left of the defective column segment. For example, if column segment 212(5) is defective, the fifth comparand bit C5 can be steered either to column segment 212(4) via MUX 501(4) or to column segment 212(6) via MUX 501(6), thereby increasing column segment replacement flexibility by allowing the defective column segment 212(5) to be functionally replaced by either the fourth column segment 212(4) or the sixth column segment 212(6). Note that other portions of the column segment shift circuits 115 that selectively steer write data to and from CAM block 511 can be implemented in a similar manner.

Figure 5B:
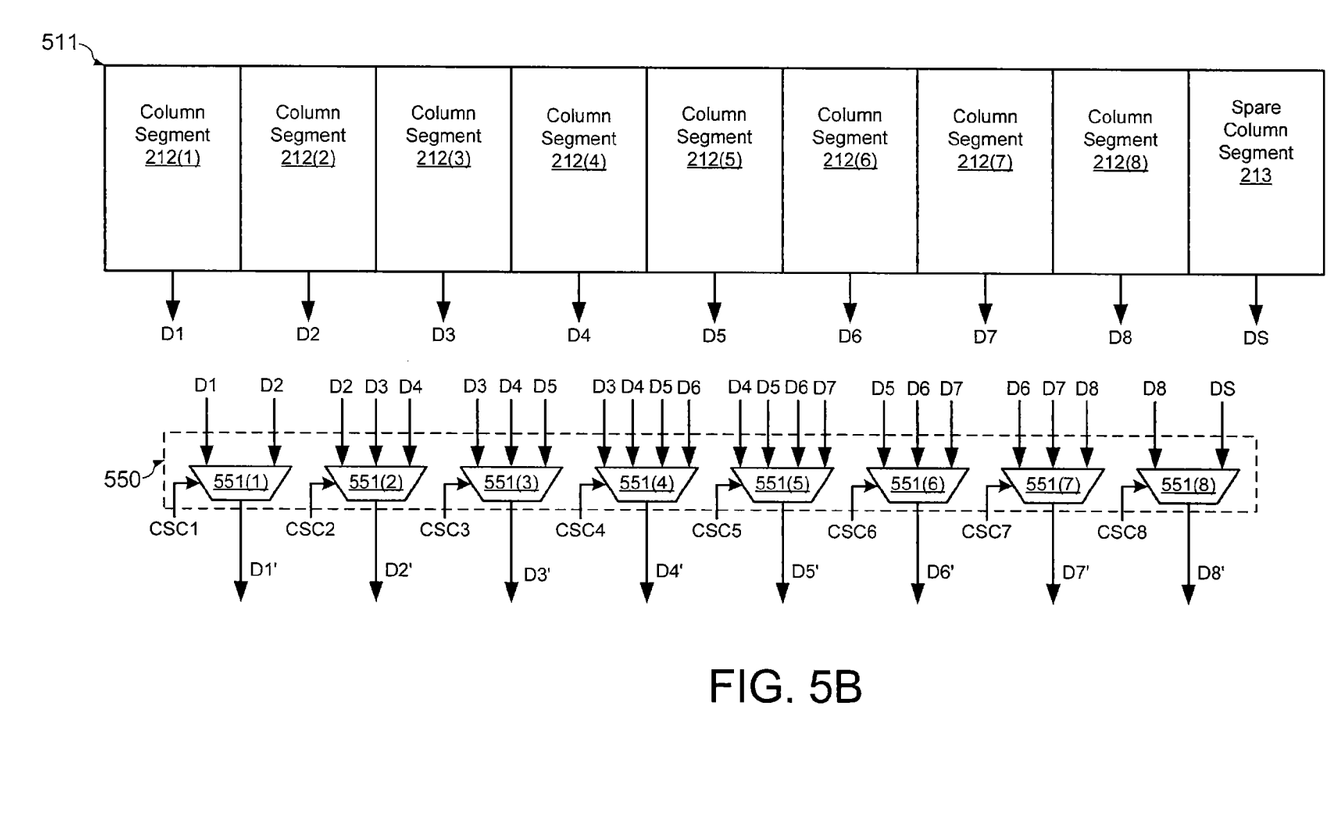
FIG. 5B is a simplified block diagram of another portion of the column segment shift circuit of FIG. 1 according to some embodiments.

FIG. 5B shows a column segment shift circuit 550 that is another portion of one embodiment of the column segment shift circuits 115 of FIG. 1 used for steering data access during read operations. Shift circuit 550 is coupled to the exemplary CAM block 511, which as discussed above includes 8 main column segments 212(1)-212(8) and one spare column segment 213 for simplicity. Thus, it is to be understood that for actual embodiments, CAM block 511 can include any number of main column segments 212 and any number of spare column segments 213. As depicted in FIG. 5B, shift circuit 550 is implemented as a distributed multiplexer (MUX) circuit having a plurality of independent MUXes 551(1)-551(8) that collectively steer data bits read from column segments 212 and/or spare column segment 213 back to their original positions to form an 8-bit data word D'. More specifically, each MUX 551 includes a number of inputs to receive data bits from various column segments 212-213 of CAM block 511, an output to provide a corresponding bit of the 8-bit data word D'[8:1] read from CAM block 511, and a control input to receive a corresponding one of column segment shift signals CSC1-CSC8. Note that for the exemplary embodiment depicted in FIG. 5B, MUXes 551 associated with the exterior column segments receive fewer bits from the CAM block 511, while MUXes 551 associated with the interior column segments receive more bits from the CAM block 511. In this manner, shift circuit 550 provides shifting flexibility similar to that of shift circuit 500 of FIG. 5A.

More specifically, MUX 551(1) selectively provides either D1 from first column segment 212(1) or D2 from second column segment 212(2) as D1' in response to CSC1, MUX 551(2) selectively provides either D2 from second column segment 212(2), D3 from third column segment 212(3), or D4 from fourth column segment 212(4) as D2' in response to CSC2, MUX 551(3) selectively provides either D3 from third column segment 212(3), D4 from fourth column segment 212(4), or D5 from fifth column segment 212(5) as D3' in response to CSC3, MUX 551(4) selectively provides either D3 from third column segment 212(3), D4 from fourth column segment 212(4), D5 from fifth column segment 212(5), or D6 from sixth column segment 212(6) as D4' in response to CSC4, MUX 551(5) selectively provides either D4 from fourth column segment 212(4), D5 from fifth column segment 212(5), D6 from sixth column segment 212(6), or D7 from seventh column segment 212(7) as D5' in response to CSC5, MUX 551(6) selectively provides either D5 from fifth column segment 212(5), D6 from sixth column segment 212(6), or D7 from seventh column segment 212(7) as D6' in response to CSC6, MUX 551(7) selectively provides either D6 from sixth column segment 212(6), D7 from seventh column segment 212(7), or D8 from eighth column segment 212(8) as D7' in response to CSC7, and MUX 551(8) selectively provides either D8 from eighth column segment 212(8) or DS from spare column segment 213 as D8' in response to CSC8.

When there are no defects in the CAM block 511, shift circuit 550 forwards data bits D1-D8 from corresponding column segments 212(1)-212(8) as bits D1'-D8', respectively, for output as an 8-bit data word during read operations. Thus, for example, when there are no defects, MUX 551(1) passes the first data bit D1 from first column segment 212(1) as D1', MUX 551(2) passes the second data bit D2 from second column segment 212(2) as D2', and so on, where MUX 501(8) passes the last data bit D8 from the eighth column segment 212(8) as D8'.

When there are defects in one of the main column segments 212 of the CAM block 511, shift circuit 550 shifts data bits read from CAM block 551 back to their original positions (e.g., by shifting data read from column segments subsequent to the defective column segment by one column to the left) during read operations. For example, if the fifth column segment 212(5) is defective, then shift circuit 550 shifts the data bit read from column segment 212(6) to the left by one position for output as D5', shifts the data bit read from column segment 212(7) to the left by one position for output as D6', shifts the data bit read from column segment 212(8) to the left by one position for output as D7', and shifts the data bit read from spare column segment 213 to the left by one position for output as D8'.

While particular embodiments have been shown and described, it will be obvious to those skilled in the art that changes and modifications can be made without departing from this disclosure in its broader aspects and, therefore, the appended claims are to encompass within their scope all such changes and modifications as fall within the true spirit and scope of this disclosure.

Further, it should be noted that the various circuits disclosed herein can be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions can be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions can be embodied include, but are not limited to, non-volatile storage media in various forms (e.g., optical, magnetic or semiconductor storage media).

What is claimed is:

1. A content addressable memory (CAM) device comprising:
   an array including:
      a main column of CAM cells including a plurality of main column segments,
      a spare column of CAM cells including a plurality of spare column segments, and
      a plurality of CAM blocks, wherein a CAM block from the plurality of CAM blocks includes a main column segment from the plurality of main column segments and a spare column segment from the plurality of column segments; and
   a column segment shift circuit coupled to the CAM block and configured to functionally replace the main column segment with the spare column segment based on a determination that the main column segment is defective.

2. The CAM device of claim 1, wherein functionally replacing the main column segment with the spare column segment by the column segment shift circuit comprises:
   replacing the main column segment with the spare column segment.

3. The CAM device of claim 1, wherein the array includes an additional main column of CAM cells including a plurality of additional main column segments, wherein the CAM block includes an additional main column segment from the plurality of additional main column segments, and wherein functionally replacing the main column segment with the spare column segment by the column segment shift circuit comprises:
   replacing the main column segment with the additional main column segment; and
   functionally replacing the additional main column segment with the spare column segment, wherein the main column segment and the additional main column segment are adjacent to each other.

4. The CAM device of claim 3, wherein functionally replacing the additional main column segment with the spare column segment by the column segment shift circuit further comprises:
   replacing the additional main column segment with the spare column segment.

5. The CAM device of claim 1, wherein the spare column segment and the main column segment are adjacent to each other.

6. The CAM device of claim 1, wherein based on the determination that the main column segment is defective, the main column segment is excluded from compare operations in the CAM device.

7. The CAM device of claim 1, wherein the column segment shift circuit is also coupled to an additional CAM block from the plurality of CAM blocks.

8. The CAM device of claim 1, further comprising:
   a column decoder to generate a plurality of column segment control signals in response to receiving a main column segment address associated with the main column segment, a respective column segment control signal indicating whether a corresponding column segment is defective.

9. The CAM device of claim 8, wherein functionally replacing the main column segment with the spare column segment by the column segment shift circuit comprises:
   steering data from the main column segment to the spare column segment in response to the plurality of column segment control signals.

10. The CAM device of claim 1, further comprising:
    a plurality of main bit line segments coupled to the main column segment; and
    a plurality of spare bit line segments coupled to the snare column segment,
    wherein the column segment shift circuit is configured to functionally replace the plurality of main bit line segments with the plurality of spare bit line segments based on the determination that the main column segment is defective.

11. The CAM device of claim 1, further comprising:
    a plurality of main comparand line segments coupled to the main column segment; and
    a plurality of spare comparand line segments coupled to the spare column segment, and
    wherein the column segment shift circuit is configured to functionally replace the plurality of main comparand line segments with the plurality of spare comparand line segments based on the determination that the main column segment is defective.

12. The CAM device of claim 11, wherein based on the determination that the main column segment is defective, the column segment shift circuit is configured to drive the plurality of main comparand line segments to a predetermined logic state to prevent the main column segment from participating in compare operations in the CAM device.

13. The CAM device of claim 1, wherein a respective CAM cell comprises a quaternary CAM cell.

14. The CAM device of claim 1, further comprising:
    an address decoder having an input to receive an address and having a plurality of output ports each coupled to a corresponding one of the plurality of CAM blocks.

15. A content addressable memory (CAM) device comprising:
    an array of a plurality of CAM blocks including:
       a main column of CAM cells including a plurality of main column segments of CAM cells, a spare column of CAM cells including a plurality of spare column segments of CAM cells, a first CAM block including a first main column segment of CAM cells from the plurality of main column segments, wherein each CAM cell from the first main column segment is coupled to a plurality of first main bit line segments, and a first spare column segment of CAM cells from the plurality of spare column segments, wherein each CAM cell from the first spare column segment is coupled to a plurality of first spare bit fine segments, and a second CAM block including a second main column segment of CAM cells from the plurality of main column segments, wherein each CAM cell front the second main column segment is coupled to a plurality of second main bit line segments, and a second spare column segment of CAM cells from the plurality of spare column segments, wherein each CAM cell from the second spare column segment is coupled to a plurality of second spare bit line segments; and a column segment shift circuit, coupling the plurality of first main bit line segments and the plurality of first spare bit line segments with the plurality of second main bit line segments and the plurality of second spare bit line segments, configured to:

functionally replace the first main column segment with the first spare column segment based on a determination that the first main column segment is defective, and functionally replace the second main column segment with the second spare column segment based on a determination that the second main column segment is defective.

16. The CAM device of claim 15, wherein the first main column segment and the first spare column segment are adjacent to each other.

17. The CAM device of claim 15, wherein the array includes an additional main column of CAM cells including a plurality of additional main column segments, wherein the CAM block includes an additional main column segment from the plurality of additional main column segments, and wherein functionally replacing the first main column segment with the first spare column segment by the column segment shift circuit comprises:

replacing the first main column segment with the additional main column segment; and functionally replacing the additional main column segment with the first spare column segment, wherein the first main column segment and the additional main column segment are adjacent to each other.

18. The CAM device of claim 17, wherein functionally replacing the first main column segment with the first snare column segment by the column segment shift circuit further comprises:

replacing the additional main column segment with the first spare column segment.

19. The CAM device of claim 15, wherein the first main column segment is excluded from compare operations in the CAM device.

20. The CAM device of claim 15, further comprising:

a column decoder to generate a plurality of column segment control signals in response to receiving a first main column segment address associated with the first main column segment, a respective column segment control signal indicating whether a corresponding column segment is defective.

21. The CAM device of claim 20, wherein functionally replacing the first main column segment with the first spare column segment by the column segment shift circuit comprises:

steering data the first main column segment to the first spare column segment in response to the plurality of column segment control signals.

22. The CAM device of claim 15, wherein the column segment shift circuit is configured to functionally replace the plurality of first main bit line segments of the first main column segment with the plurality of first spare bit line segments of the first spare column segment.

23. The CAM device of claim 15, further comprising:

a plurality of first main comparand line segments coupled to the first main column segment; and a plurality of first spare comparand line segments coupled to the first spare column segment, wherein the column segment shift circuit is configured to functionally replace the plurality of first main comparand line segments with the plurality of first spare comparand line segments based on the determination that the first main column segment is defective.

24. The CAM device of claim 23, wherein based on the determination that the first main column segment is defective, the column segment shift circuit is configured to drive the plurality of first main comparand line segments of the first main column segment to a predetermined logic state to prevent the first main column segment from participating in compare operations in the CAM device.

25. The CAM device of claim 15, wherein a respective CAM cell comprises a quaternary CAM cell.

26. The CAM device of claim 15, further comprising:

an address decoder having an input to receive an address and having a plurality of outputs each coupled to a corresponding one of the plurality of CAM blocks.

27. The CAM device of claim 1, wherein another CAM block of the plurality of CAM blocks shares bit lines and comparand lines with the CAM block.

* * * * *

UNITED STATES PATENT AND TRADEMARK OFFICE
CERTIFICATE OF CORRECTION

| | |
|---|---|
| PATENT NO. | : 8,982,596 B1 |
| APPLICATION NO. | : 13/301499 |
| DATED | : March 17, 2015 |
| INVENTOR(S) | : Srinivasan Varadarajan |

Page 1 of 1

It is certified that error appears in the above-identified patent and that said Letters Patent is hereby corrected as shown below:

In the Claims

Column 17, line 13, please replace "cell front the" with --cell from the--.

Signed and Sealed this
Twenty-third Day of June, 2015

Michelle K. Lee
*Director of the United States Patent and Trademark Office*